(12) United States Patent
Kim

(10) Patent No.: US 6,703,653 B2
(45) Date of Patent: Mar. 9, 2004

(54) IMAGE SENSOR HAVING PHOTODIODE ON SUBSTRATE

(75) Inventor: Chae-Sung Kim, Ichon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/330,273

(22) Filed: Dec. 30, 2002

(65) Prior Publication Data

US 2003/0132467 A1 Jul. 17, 2003

(30) Foreign Application Priority Data

Jan. 11, 2002 (KR) .......................................... 2002-1704

(51) Int. Cl.[7] ............................................ H01L 31/113
(52) U.S. Cl. ...................... 257/290; 257/291; 257/292; 257/233; 257/239; 257/238
(58) Field of Search ................................. 257/290, 291, 257/292, 233, 239, 238, 244

(56) References Cited

U.S. PATENT DOCUMENTS

| | | | |
|---|---|---|---|
| 6,184,055 B1 | * | 2/2001 | Yang et al. ..................... 438/57 |
| 6,218,691 B1 | * | 4/2001 | Chung et al. ................ 257/290 |
| 6,297,070 B1 | * | 10/2001 | Lee et al. ...................... 438/57 |
| 6,441,412 B2 | * | 8/2002 | Oh et al. ..................... 257/292 |
| 6,472,245 B2 | * | 10/2002 | Lee .............................. 438/59 |
| 6,566,678 B1 | * | 5/2003 | Maeda et al. .................. 257/22 |

OTHER PUBLICATIONS

Shinji Ohsawa et al.: IEEE Transactions on Electron Devices, vol. 44, No. 10, Oct. 1997, p. 1667–1671.

* cited by examiner

*Primary Examiner*—Minhloan Tran
*Assistant Examiner*—Pershelle Greene
(74) *Attorney, Agent, or Firm*—Birch, Stewart, Kolasch & Birch, LLP

(57) ABSTRACT

The present invention relates to a photodiode of an image sensor. Particularly, the photodiode is formed on a substrate so that an occupying area of a unit pixel of the image sensor is reduced. To achieve this effect, there is provided an image sensor comprising a photodiode receiving light, a floating diffusion area receiving photo-charges generated in the photodiode, a transfer transistor transferring the photo-charges from the photodiode to the floating diffusion area, a reset transistor controlling a voltage of the floating diffusion area, a drive transistor driven by the photodiode and supplying a source voltage and select transistor for addressing, the photodiode including: a first conductive layer formed on a semiconductor substrate and connected to an impurity area in the semiconductor substrate, wherein the semiconductor substrate has a first conductive type, the first conductive layer and the impurity area have a second conductive type; and a second conductive layer formed on the first conductive layer, wherein the second conductive layer has the first conductive type.

11 Claims, 5 Drawing Sheets

IMAGE SENSOR HAVING PHOTODIODE ON SUBSTRATE

This nonprovisional application claims priority under 35 U.S.C. §119(a) on Patent Application No. 2002-2704 filed in KOREA on Jan. 11, 2002, which is herein incorporated by reference.

1. Field of the Invention

The present invention relates to a photodiode of an image sensor; and, more particularly, to a photodiode of an image sensor of which unit pixel area is decreased by forming the photodiode on a semiconductor substrate.

2. Description of Related Arts

Generally, an image sensor is a semiconductor device that converts an optical image into an electric signal. Among the image sensors, a charge coupled device (CCD) is a device wherein each metal-oxide-silicon (hereinafter referred as to MOS) capacitor is closely located and charges are stored into the MOS capacitor and transferred. A complementary metal oxide semiconductor (hereinafter referred as to CMOS) image sensor employs CMOS technology that uses a control circuit and a signal processing circuit as peripheral circuits and adopts a switching mode that detects outputs sequentially. MOS transistors formed in the peripheral circuit as the same number of pixels.

There are several problems in using the CCD due to its complex driving mode, high power dissipation, a complex process having lots of steps for a mask process and a difficulty in one chip realization since the signal processing circuit cannot be constructed on a CCD chip. Therefore, there has been actively researched on the CMOS image sensor that uses sub-micron CMOS technology to overcome the above problems. The CMOS image sensor obtains an image by forming a photodiode and a MOS transistor within a unit pixel and then detecting signals sequentially through a switching mode. The use of the CMOS technology results in less-power dissipation and an enabled one chip process for the signal processing circuit. Also, compared with the CCD process that requires approximately 30 to 40 masks, the CMOS image sensor implemented with the CMOS technology needs approximately 20 masks because of a simplified process. Hence, the CMOS image sensor is currently highlighted as a next generation image sensor.

FIG. 1A is a circuit diagram showing a unit pixel of a conventional CMOS image sensor including a photodiode and four transistors in a unit pixel. Particularly, the unit pixel includes one photodiode (hereinafter referred as to PD) and four negative-channel-metal-oxide semiconductor (NMOS) transistors. The NMOS transistors includes a transfer transistor Tx for transferring charges collected at the PD to a floating diffusion area (hereinafter referred as to FD), a reset transistor Rx for resetting the FD by setting an electric potential of the FD to a desired value and discharging charges, a drive transistor Dx that enacts as a source follower buffer amplifier and a select transistor Sx for providing an addressing function. Also, there exists a load transistor outside of the unit pixel for reading an output signal.

FIG. 1B is a circuit diagram showing a unit pixel of an image sensor including one PD and three transistors in a unit pixel. These three transistors are identical transistors of the unit pixel excluding the Tx and the FD.

In other words, the unit pixel has a structure wherein optical charges generated at the PD are directly inputted to a gate electrode of the Dx instead of inputting to the Tx, and drives the Dx.

Also, a Rx and a Sx of this unit pixel have similar functions as of the unit pixel having four transistors. The Rx initializes the PD in accordance with a signal inputted to the gate electrode, and the Sx transmits an output of the Dx to an outer part of the unit pixel in accordance with a switching signal inputted to the gate electrode.

The PD in the conventional image sensor having the above circuit structure occupies large areas since it is formed on an active area of a semiconductor substrate. Also, since transistors such as Tx, Rx, Dx and Sx are also formed on the active area, the area that can be used for the PD is actually less than a half of the total unit pixel area. Therefore, the conventional image sensor has a disadvantage of a decreased fill factor, which is a ratio of an optical sensing part occupied within the unit pixel.

SUMMARY OF THE INVENTION

It is, therefore, an object of the present invention to provide an image sensor improved on a fill-factor by modifying a process for forming a photodiode.

In accordance with an aspect of the present invention, there is provided an image sensor comprising a photodiode receiving light, a floating diffusion area receiving photo-charges generated in the photodiode, a transfer transistor transferring the photo-charges from the photodiode to the floating diffusion area, a reset transistor controlling a voltage of the floating diffusion area, a drive transistor driven by the photodiode and supplying a source voltage and select transistor for addressing, the photodiode including: a first conductive layer formed on a semiconductor substrate and connected to an impurity area in the semiconductor substrate, wherein the semiconductor substrate has a first conductive type, the first conductive layer and the impurity area have a second conductive type; and a second conductive layer formed on the first conductive layer, wherein the second conductive layer has the first conductive type.

In accordance with another aspect of the present invention, there is provided an image sensor comprising a photodiode receiving light, a floating diffusion area receiving photo-charges generated in the photodiode, a transfer transistor transferring the photo-charges from the photodiode to the floating diffusion area, a reset transistor controlling a voltage of the floating diffusion area, a drive transistor driven by the photodiode and supplying a source voltage and select transistor for addressing, the image sensor further comprising: a semiconductor substrate, wherein the semiconductor substrate has a first conductive type; a gate electrode of the driver transistor on the semiconductor substrate; and a photodiode including a first conductive layer connected to the gate electrode of the driver transistor and a second conducive layer on the first conductive layer, wherein the first conductive layer has a second conductive type and the second conductive layer has the first conductive type.

The present invention employs a technology used for forming a capacitor in a dynamic random access memory (DRAM) device so that a fill-factor is enhanced by forming a photodiode at an upper side of a transistor.

In a conventional unit pixel of an image sensor, a photodiode is typically formed on an active area and stores optical charges into a depletion layer to generate an image. However, the photodiode has a limitation in decreasing an area in contrary to other components of which size can be decreased due to technological advancement related to processes. The reason for this limitation is because of a wavelength of light and an interference occurring between photodiodes nearly located.

In the present invention, dynamic random access memory (DRAM) process technology is used to increase a fill-factor by constructing the photodiode as in an antenna form as to generate an optical charge after receiving an incident light from upper sides of a transistor, and forming other transistors or elements on an active area.

BRIEF DESCRIPTION OF THE DRAWING(S)

The above and other objects and features of the present invention will become apparent from the following description of the preferred embodiments given in conjunction with the accompanying drawings, in which.

DETAILED DESCRIPTION OF THE INVENTION

Figure 1A:
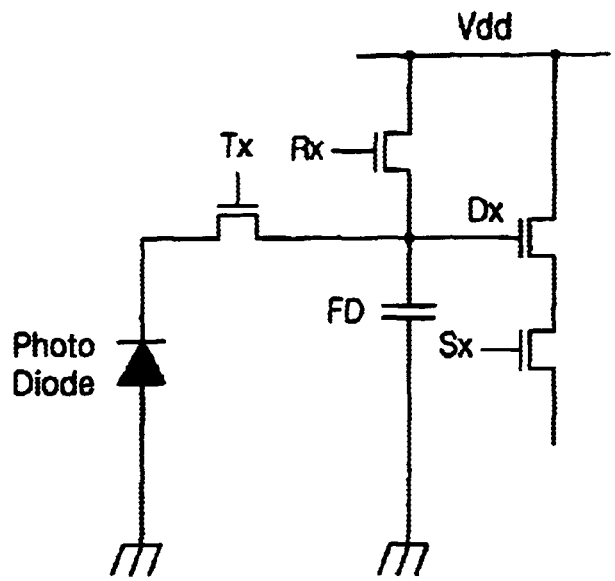
FIGS. 1A and 1B are circuit diagrams showing a unit pixel of a conventional image sensor.
Figure 1B:
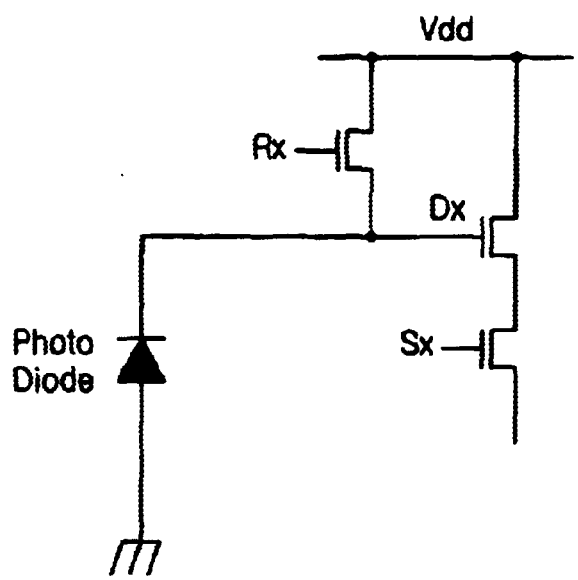
Figure 2:
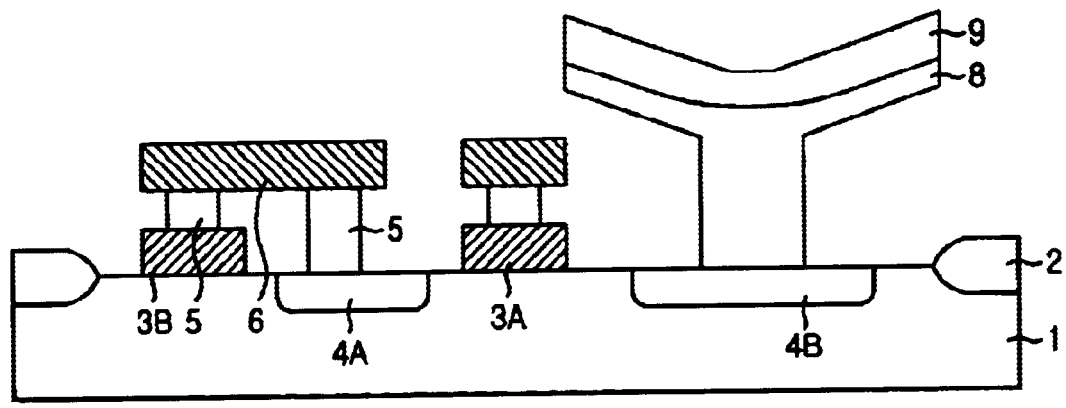
FIG. 2 is a cross-sectional view depicting a unit pixel including four transistors in accordance with a first embodiment of the present invention.

FIG. 2 is a cross-sectional view depicting a unit pixel of an image sensor including four negative-channel-metal-oxide semiconductor (NMOS) transistors in accordance with a first embodiment of the present invention. FIGS. 3A to 3E are cross-sectional views illustrating a process for forming the unit pixel shown in FIG. 2.

Referring to FIG. 2, the unit pixel of the image sensor in accordance with a first embodiment of the present invention includes a p-type substrate 1, a field insulating layer 2 formed on the p-type substrate 1, gate electrodes formed on the p-type substrate 1, n+ impurity areas corresponding to a floating diffusion area 4A(hereinafter referred as to FD) and a source/drain area 4A of a transistor, a metal line 6, a contact plug 5 and a photodiode (hereinafter referred as to PD).

In FIG. 2, a gate electrode 3A of a transfer transistor Tx and a gate electrode 3B of a drive transistor Dx is shown. The contact plug 5 connects the each gate electrode 3A, 3B and the FD 4A to the metal line 6. The PD includes an n-type conductive layer 8 connected to the source/drain area 4B and a p-type conductive layer formed on the n-type conductive layer 8. The n-type conductive layer 8 and the p-type conductive layer 8 form a pn junction.

Although it is not illustrated in FIG. 2, the p-type conductive layer 9 is connected to the substrate 1 or a ground terminal. In a preferred embodiment of the present invention, the n-type conductive layer 8 is formed with polysilicon doped with an n-type dopant and the p-type conductive layer 9 is formed with polysilicon doped with a p-type dopant.

Among plurality of electron-vacancy couples generated by lights incident to the photodiode consisting of the n-type conductive layer 8 and the p-type conductive layer 9, electrons are transferred to the source/drain area 4B so to be used for generating an image, whereas vacancies are drained to the substrate 1. The n-type conductive layer 8 is highly expanded towards lateral sides compared to a lower structure formed under the PD.

FIG. 2 does not show a reset transistor Rx and a select transistor Sx although they are included in the unit pixel of the image sensor. The PD in accordance with the preferred embodiment of the present invention as illustrated in FIG. 2 is formed an upper side of the metal line 6, thereby being able to realize a unit pixel in a smaller area compared to a conventionally constructed unit pixel. The operational schemes of the unit pixel shown in FIG. 2, are identical to those of the conventional unit pixel including four metal oxide (MOS) transistors.

In more details with respect to the operational scheme, the Tx controls a signal of the PD. If the Tx is turned off, then optical charges are continuously accumulated, and the accumulated optical charges are transferred to the FD when the Tx is turned on. The Rx initializes an electric potential of the FD. In case of turning on the Rx, the FD is initialized with a voltage Vdd and the initialization operation is stopped when the Rx is turned off.

The FD maintains a value of the voltage Vdd when the Rx is turned on, and drives an output by inputting a change in electric potential to a gate electrode of the Dx. Particularly, the electric potential changes to a decreased value due to an electron transferred from the PD when the Tx is turned on.

The Sx determines only whether or not the output of the Dx is transmitted to an outer part of the unit pixel.

The preferred embodiment of the present invention uses only one metal line. However, it is possible to use two or more metal lines and form the PD on upper sides of these metal lines.

Figure 3A:
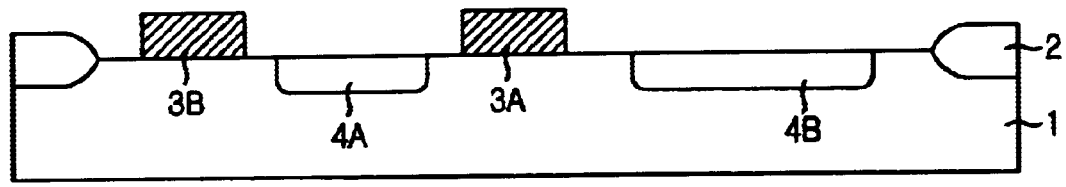
FIGS. 3A to 3E are cross-sectional views illustrating a process for fabricating the unit pixel shown in FIG. 2.

A process for forming the above-described unit pixel will be described with reference to FIGS. 3A to 3E. Referring to FIG. 3A, the field insulating layer 2 is formed on the substrate 1, and the gate electrodes 3A,3B are subsequently formed on the substrate 1. A process for forming gate spacers can be preformed. After forming the gate electrodes 3A, 3B, the n+ impurity areas corresponding to a FD 4A and a source/drain area 4B of a transistor are formed.

Next, an inter-layer insulating layer (not shown) is formed on an entire surface of the substrate 1 including the gate electrodes 3A, 3B, and then the inter-layer insulating layer is selectively etched to form a contact hole(not shown) that exposes a surface of the source/drain area 4A and the gate electrodes 3A, 3B.

Figure 3B:
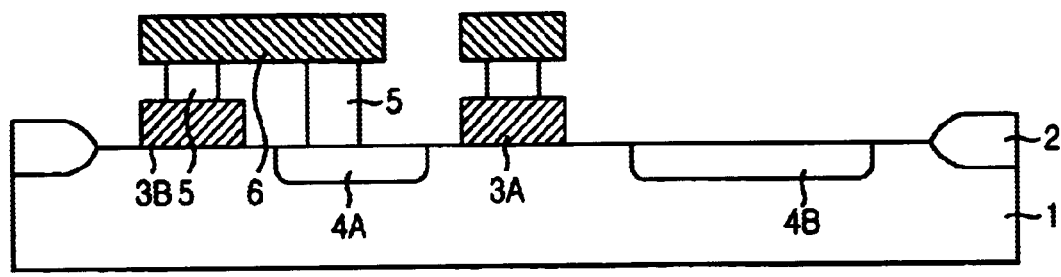

With respect to FIG. 3B, the contact plug 5 is completely formed by burying conductive materials within the contact hole. Afterwards, the metal line 6 is formed.

Figure 3C:
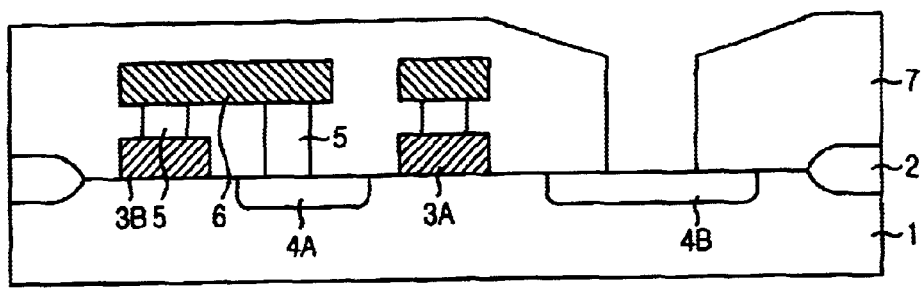

With reference to FIG. 3C, an insulating layer 7 is formed on an entire surface of the substrate 1 including the metal line, and a hole that exposes a surface of the source/drain area 4B of the Tx is formed. Especially, the hole is formed in a shape that its upper side has a wider area in order to receive lots of incident light.

Figure 3D:
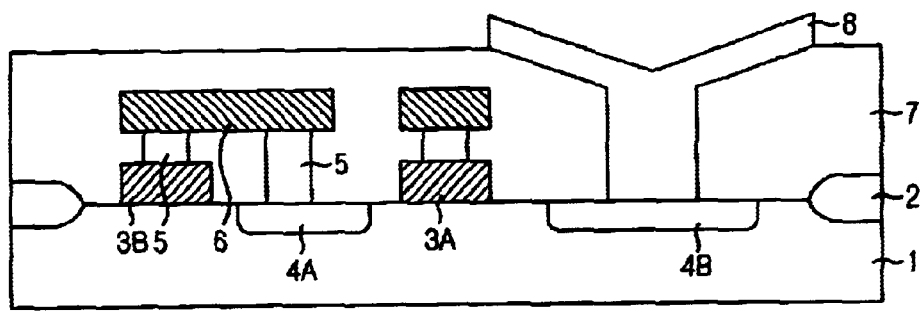

With reference to FIG. 3D, the n-type conductive layer 8 that are buried inside of the hole and has a wider area in its upper portion is deposited. The n-type conductive layer 8 becomes an n-type area constituting the PD, and is formed with polysilicon doped with an n-type dopant in accordance with the present invention.

Figure 3E:
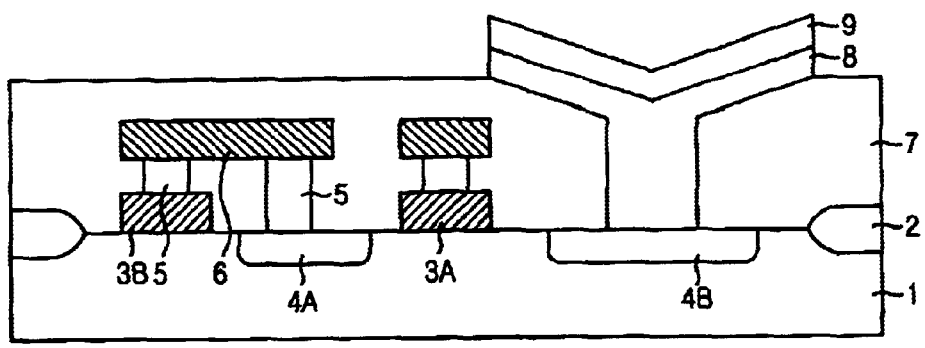

Referring to FIG. 3E, the p-type conductive layer 9 is formed on the n-type conductive layer 8, and connected to the substrate 1 or a ground terminal.

When an incident light is inputted to the PD having the above structure, an electron-vacancy couple is generated in a depletion layer formed at the pn junction area. Then, the vacancy is drained to the ground terminal or the substrate 1, and the electron is transferred to the source area 4 of the Tx so as to be used for generating an image.

Figure 4:
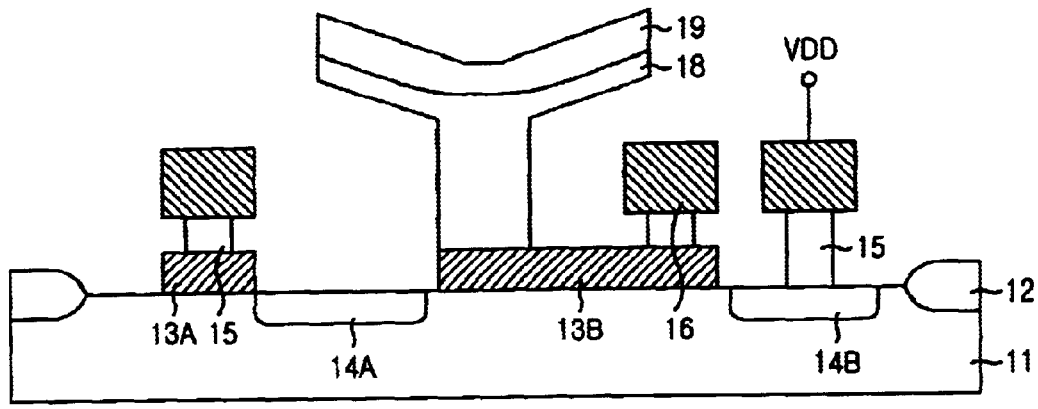
FIG. 4 is a cross-sectional view showing a unit pixel including three transistors in accordance with a second embodiment of the present invention.

FIG. 4 is a cross-sectional view showing a unit pixel of an image sensor including three NMOS transistors in a unit cell in accordance with a second embodiment of the present invention. FIGS. 5A to 5E are cross-sectional views illustrating a process for forming the unit pixel shown in FIG. 4.

Referring to FIG. 4, the unit pixel of the image sensor in accordance with the present invention includes a p-type substrate 11, a field insulating layer 12 formed on the p-type substrate 11, gate electrodes 13A, 13B are formed on the p-type substrate 11, an n+ impurity areas corresponding to a source/drain areas 14A, 14B of transistors, a metal line 16, a contact plug 15 for connecting the gate electrode 13 and the n+ impurity area 14 to the metal line 16, a PD including an n-type conductive material 18 being directly connected to gate electrode 13 and a p-type conductive material 19 for forming a pn junction by being connected to the n-type conductive material 18. In FIG. 4, reference numeral 13A denotes a gate electrode of the select transistor and reference numeral 13B denotes a gate electrode of the drive transistor. In FIG. 4, reference numeral 14A denotes a source/drain of gate electrode of the select transistor and reference numeral 14B denotes a source/drain of the driver transistor.

Although it is not illustrated in FIG. 4, the p-type conductive layer 19 is connected to the substrate 11 or a ground terminal. In a preferred embodiment of the present invention, the n-type conductive layer 18 is formed with polysilicon doped with an n-type dopant, and the p-type conductive layer 19 is formed With polysilicon doped with a p-type dopant. The n-type conductive layer 18 and the p-type conductive layer 19 form a photodiode.

Among plurality of electron-vacancy couples generated by lights incident to the photodiode consisting of the n-type conductive layer 18 and the p-type conductive layer 19, electrons are transferred to the gate electrode 13B of the driver transistor so to drive the Dx for generating an image, whereas vacancies are drained to the substrate 11 or the ground terminal. The n-type conductive layer 18 has an upper part that is highly expanded towards lateral sides compared to a lower part.

FIG. 4 does not show a reset transistor Rx although it is included in the unit pixel of the image sensor in accordance with the present invention. The operational schemes of the unit pixel shown in FIG. 4, are identical to those of the conventional unit pixel including three metal oxide transistors (MOS).

Figure 5A:
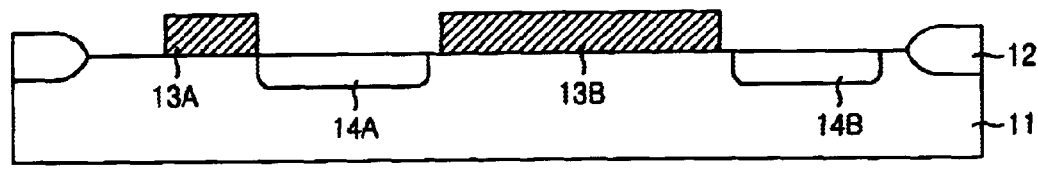
FIGS. 5A to 5E are cross-sectional views illustrating a process for fabricating the unit pixel shown in FIG. 3.

A process for forming a unit pixel having the above structure will be described with reference to FIGS. 5A to 5E. Referring to FIG. 5A, the field insulating layer 12 is formed on the substrate 11, and the gate electrodes 13A, 13B are formed on the substrate 11. A length of the gate electrode 13B of the Dx is longer than those of other transistors since the gate electrode 13B of the Dx is directly connected to the PD.

A process for forming a gate spacer can be preformed. After forming the gate electrodes 13A,13B, the n+ impurity areas corresponding to the source/drain areas 14A, 14B are formed.

Next, an inter-layer insulating layer (not shown) is formed on an entire surface of the substrate 11 including the gate electrodes 13A, 13B, and then the inter-layer insulating layer is selectively etched to form a contact hole(not shown) that exposes a surface of the source/drain area 14B and the gate electrodes 13A, 13B.

Figure 5B:
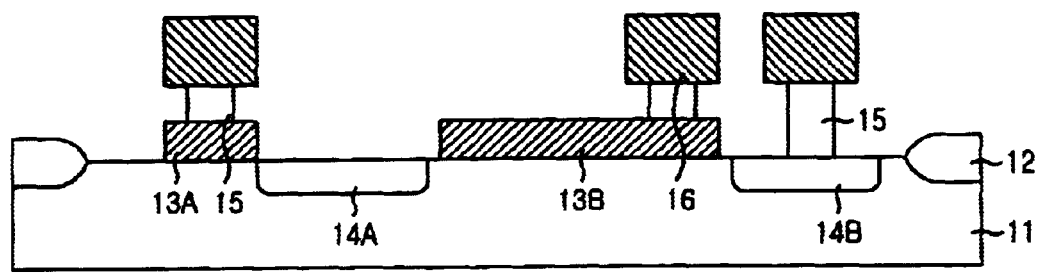

Referring to FIG. 5B, the contact plug 15 for connecting the gate electrodes 13, 13B and the source/drain area 14B to the metal line 16 is formed within the contact hole.

Figure 5C:
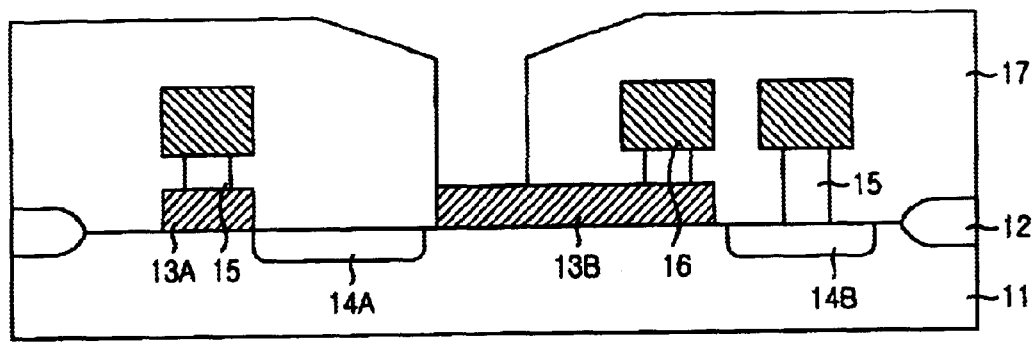

With reference to FIG. 5C, an insulating layer 17 is formed on an entire surface of the substrate 11 including the metal line 16, and a hole that exposes a surface of the gate electrode 13B of the Dx is formed. Especially, the hole is formed in a shape that its upper portion has a wider area so as to receive lots of incident lights.

Figure 5D:
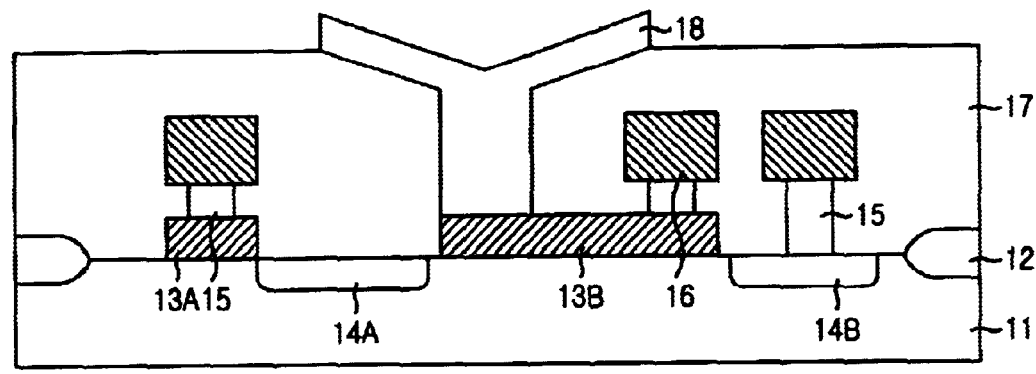

With reference to FIG. 5D, the n-type conductive layer 18 that has a wide area in an upper side and is buried inside of the hole is deposited. The n-type conductive layer 18 becomes an n-type area constituting the PD, and is formed with polysilicon doped with an n-type dopant in the present invention.

Figure 5E:
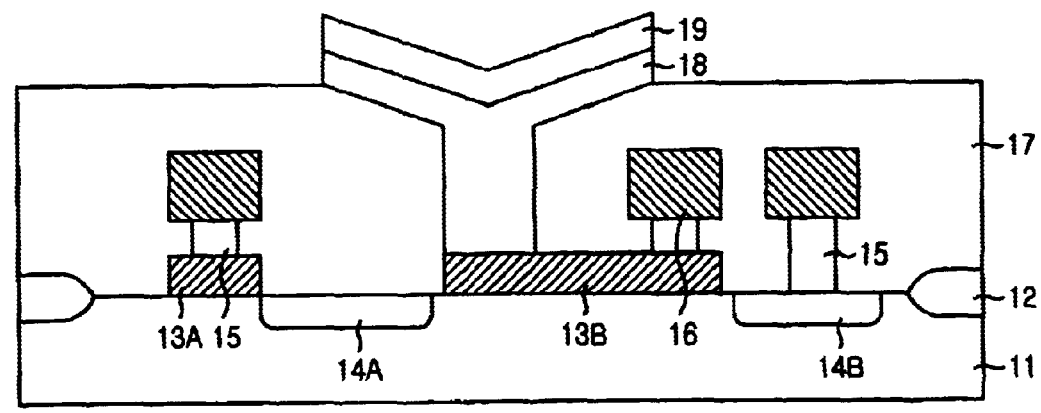

Referring to FIG. 5E, the p-type conductive material 19 is formed on the n-type conductive material 18, and connected to the substrate 11 or a ground terminal.

When an incident light is inputted to the PD having the above structure, an electron-vacancy couple is generated in a depletion layer formed at the pn junction area. Then, the vacancy is transferred to the ground terminal or the substrate 11, and the electron is directly transferred to the gate electrode 13B of the Dx so as to drive the Dx for generating an image.

By following the preferred embodiment of the present invention, it is possible to reduce an occupying area of a unit pixel and also increase a fill-factor of an image sensor.

While the present invention has been described with respect to certain preferred embodiments, it will be apparent to those skilled in the art that various changes and modifications may be made without departing from the scope of the invention as defined in the following claims.

What is claimed is:

1. An image sensor comprising a photodiode receiving light, a floating diffusion area receiving photo-charges generated in the photodiode, a transfer transistor transferring the photo-charges from the photodiode to the floating diffusion area, a reset transistor controlling a voltage of the floating diffusion area, a drive transistor driven by the photodiode and supplying a source voltage and select transistor for addressing, the photodiode including:
    a first conductive layer formed on a semiconductor substrate and connected to an impurity area in the semiconductor substrate, wherein the semiconductor substrate has a first conductive type, the first conductive layer and the impurity area have a second conductive type; and
    a second conductive layer formed on the first conductive layer, wherein the second conductive layer has the first conductive type.

2. The image sensor as recited in claim 1, wherein the floating diffusion area is under a surface of the semiconductor substrate.

3. The image sensor as recited in claim 2, further comprising:
    a gate electrode of the transfer transistor on the substrate between the impurity area and the floating diffusion area; and
    a gate electrode of the driver transistor formed on the substrate and connected to the floating diffusion area.

4. The image sensor as recited in claim 3, an interconnection line connecting the gate electrode of the driver transistor and the floating diffusion area.

5. The image sensor as recited in claim 4, wherein the photodiode is formed in a region higher than the interconnection line.

6. The image sensor as recited in claim 1, wherein area of the first conductive layer is increased bottom to top.

7. An image sensor comprising a photodiode receiving light, a floating diffusion area receiving photo-charges generated in the photodiode, a transfer transistor transferring the photo-charges from the photodiode to the floating diffusion area, a reset transistor controlling a voltage of the floating diffusion area, a drive transistor driven by the photodiode and supplying a source voltage and select transistor for addressing, the image sensor further comprising:

a semiconductor substrate, wherein the semiconductor substrate has a first conductive type;

a gate electrode of the driver transistor on the semiconductor substrate; and a photodiode including a first conductive layer connected to the gate electrode of the driver transistor and a second conducive layer on the first conductive layer, wherein the first conductive layer has a second conductive type and the second conductive layer has the first conductive type.

8. The image sensor as recited in claim 7, wherein the floating diffusion area is under a surface of the semiconductor substrate.

9. The image sensor as recited in claim 8, further comprising:

an interconnection line supplying the source voltage to the gate electrode of the driver transistor.

10. The image sensor as recited in claim 9, wherein the photodiode is formed in a region higher than the interconnection line.

11. The image sensor as recited in claim 7, wherein area of the first conductive layer is increased bottom to top.

\* \* \* \* \*

UNITED STATES PATENT AND TRADEMARK OFFICE
CERTIFICATE OF CORRECTION

PATENT NO. : 6,703,653 B2  Page 1 of 1
APPLICATION NO. : 10/330273
DATED : March 9, 2004
INVENTOR(S) : Chae-Sung Kim It is certified that error appears in the above-identified patent and that said Letters Patent is hereby corrected as shown below:

Column 1, line 5, of the patent, the priority number which is set forth as "2002-2704" should read -- 2002-1704 --. As such, the complete line should read as follows:

U.S.C. §119(a) on Patent Application No. 2002-1704 filed in

Signed and Sealed this

Twenty-eighth Day of July, 2009

JOHN DOLL
*Acting Director of the United States Patent and Trademark Office*